United States Patent [19]

Doutrich

[11] Patent Number: 4,847,588
[45] Date of Patent: Jul. 11, 1989

[54] ELECTRICAL CONNECTOR WITH PIN RETENTION FEATURE

[75] Inventor: Ray C. Doutrich, Lebanon, Pa.

[73] Assignee: E. I. Du Pont de Nemours and Company, Wilmington, Del.

[21] Appl. No.: 53,550

[22] Filed: May 26, 1987

Related U.S. Application Data

[63] Continuation of Ser. No. 836,534, Mar. 5, 1986, abandoned.

[51] Int. Cl.⁴ .......................................... H01R 13/428
[52] U.S. Cl. ...................................... 439/751; 439/82
[58] Field of Search .................................. 439/78-84, 439/751, 873

[56] References Cited

U.S. PATENT DOCUMENTS

| | | | |
|---|---|---|---|
| 2,754,486 | 7/1956 | Hathorn | 339/17 C |
| 2,958,063 | 10/1960 | Stanwyck | 339/17 C |
| 3,056,939 | 10/1962 | Rayburn | 339/17 C |
| 3,162,721 | 12/1964 | Rayburn | 174/68.5 |
| 3,239,720 | 3/1966 | Rayburn | 339/17 C |
| 3,524,108 | 8/1970 | English | 339/17 R |
| 3,747,045 | 7/1973 | Stross | 339/17 C |
| 4,407,556 | 10/1983 | Hoschett | 339/17 LC |
| 4,553,801 | 11/1985 | Zajeski | 339/59 M |
| 4,735,587 | 4/1988 | Kirayoglu | 439/82 |

FOREIGN PATENT DOCUMENTS

| | | |
|---|---|---|
| 1816073 | 2/1970 | Fed. Rep. of Germany . |
| 1916410 | 10/1970 | Fed. Rep. of Germany ...... 439/751 |
| 2742716 | 5/1979 | Fed. Rep. of Germany . |
| 2221829 | 10/1974 | France ................................ 439/751 |

OTHER PUBLICATIONS

Electronics Design, vol. 33, No. 6, Mar. 1985, pp. 142–150, Hasbrouck Heights, N.J., U.S.; J. Shereff "Special Edition Report Connectors".
Patent Abstracts of Japan., vol. 9, No. 332 (E-370) [2055], 26th Dec. 1985; & JP-A-60 164 342 (Nippon Denki) 27-08-1985.

Primary Examiner—Gary F. Paumen

[57] ABSTRACT

An electrical connector comprising a header with a plurality of terminal pins having means for retaining the header in position during soldering to a printed circuit board. Retention is accomplished by an offset formed as a crimp at the insertion end of at least one pair of terminals. The crimps exert opposite normal forces against one surface of their respective holes to retain the header during soldering.

10 Claims, 5 Drawing Sheets

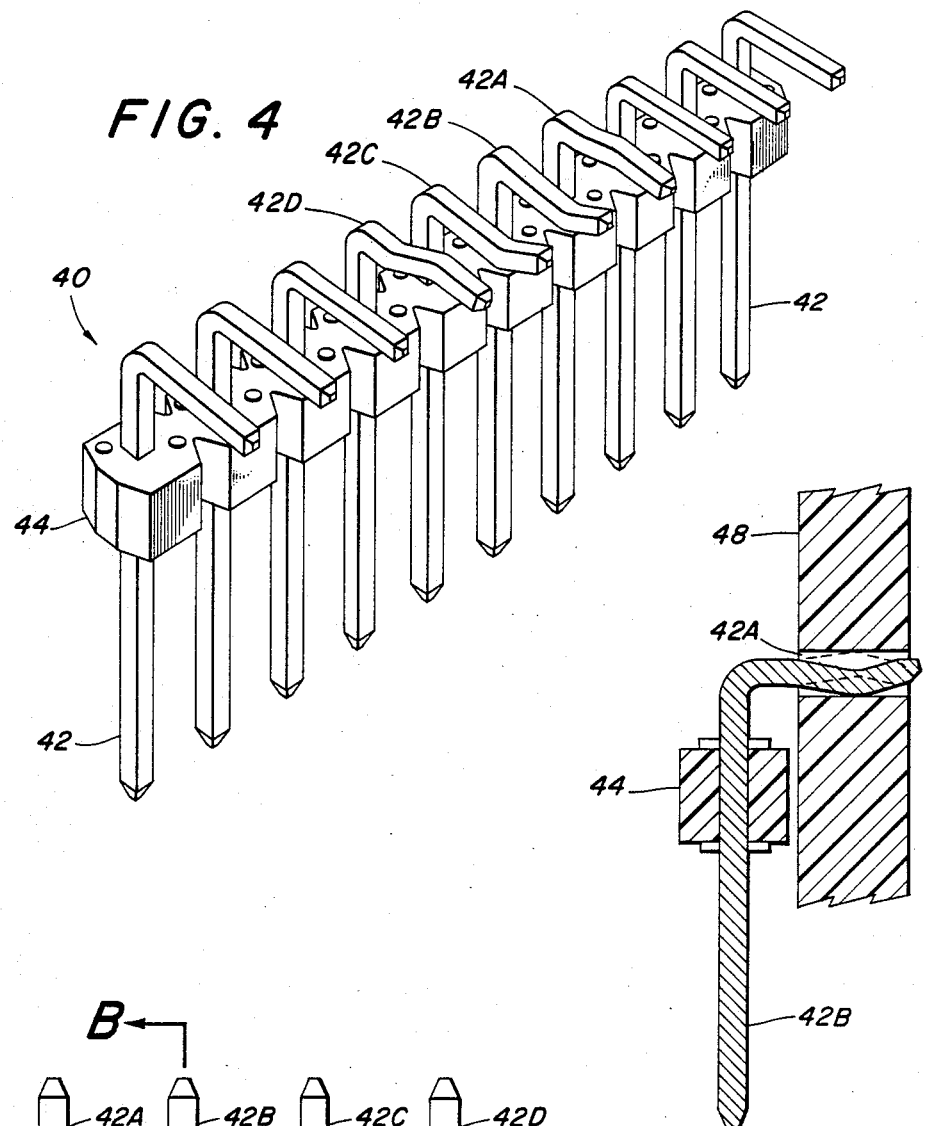
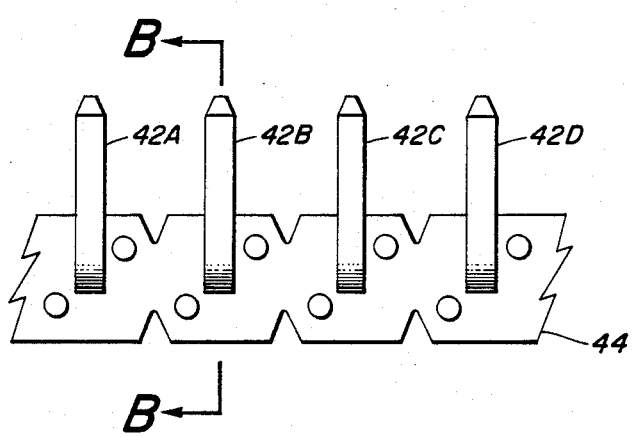
FIG. 4
FIG. 4A
FIG. 4B

ELECTRICAL CONNECTOR WITH PIN RETENTION FEATURE

This is a continuation of application Ser. No. 836,534 filed Mar. 5, 1986 now abandoned.

BACKGROUND OF THE INVENTION

1. Field of the Invention

This invention relates to electrical connectors affixed to printed circuit boards and, more particularly, to providing retaining means for such connectors while its terminal pins are soldered to the printed circuit board.

2. Description of Related Art

Since the advent of the printed circuit board, electrical components have generally been affixed to the board by soldering the component leads to the printed electrical pattern. Often times the component leads extend through the board's holes and must be soldered in this position.

One of the problems encountered in such operations is maintaining the components in the desired position or orientation during assembly and soldering. Various attempts have been made to solve this problem. In earlier times when discrete electrical components such as capacitors and resistors were commonly affixed in large numbers to printed circuit boards, various lead locking arrangements were suggested. For example, in U.S. Pat. No. 2,754,486 granted July 10, 1956 to C. J. Hathorn, the two relatively soft lead wires of a resistor were twisted in a configuration so when inserted, the leads temporarily lock by hooking around the side and edge of the board holes, to thereby hold the resistor in place while soldering. Similar approaches were proposed for capacitors in U.S. Pat. No. 3,162,721, granted Dec. 22, 1964. U.S. Pat. No. 3,056,939 granted Oct. 2, 1962, and U.S. Pat. No. 3,239,720 granted Mar. 8, 1962, all to C. C. Rayburn, as well as U.S. Pat. No. 3,747,045 granted July 17, 1973 to H. A. Stross. Where such discrete components have been packaged together, similar techniques have been tried. U.S. Pat. No. 3,524,108 granted Aug. 11, 1970 to J. A. English, for example, discloses a board mounted modular circuit component comprising a hard dielectric ceramic material supporting a number of active and passive components with multiple, self-locking leads bent into a configuration so as to provide cam surfaces for contacting the printed circuit board holes.

Retention during soldering is particularly important in connection with the more recent multi-terminal connectors. Where such connectors have flat, thin leads, which can be readily crimped as in the discrete components of the past, the retention is not a serious problem. This is because the easily crimped flat, thin leads usually have a large offset permitting adequate room to pass through the board holes. The crimped portion passes completely through holes and locks to the other end of the holes. To provide adequate retention, the thickness of the board and location are critical.

In the case of electrical connector headers, lead locking arrangements of the prior art are not easily applied. Such headers include numerous male terminal pins surrounded by various plastics. The male pins are typically square metal posts approximately 0.025 inches square and are very stiff. Because of the size and stiffness of such square male pins, headers are soldered to printed circuit utilizing various hold-down devices to retain the header in place during the soldering operation. Such devices include mechanical fasteners such as bolts and screws. Weighted plates are also used. These are placed atop the headers and removed after the soldering process. Although such methods work, they are expensive because they are labor intensive.

Within the last few years, methods of attachment which are an integral part of the header have been sought. What has been tried typically involves employing a single male pin in the header which will interfere with one printed circuit board hole. The male pin used is commonly one of the commercially available compliant-type pins. Such pins, however, usually require high insertion forces on the order of 40 pounds. Also, they are useful for one insertion only.

The move to robotic insertion has lead to a need for a header that can be mechanically placed on a printed circuit board and automatically retained through subsequent board handling and soldering operations. Robotic loaders typically have an upper limit on insertion forces (for example, about 15 pounds) to protect the circuit board in case of a misplaced or damaged component. As this load limit is reached, the insertion head of the robotic loader retracts to provide this safety feature. Consequently, retention features must have relatively low insertion forces to be used with robotic loaders.

SUMMARY OF THE INVENTION

The present invention provides a solution for retaining an electrical connector header in the correct position during soldering and other handling operations. The terminal end of one or more pairs of male pins are deformed or crimped in such a manner that they operate in conjunction with one or more pairs of printed circuit board holes to retain the entire header in the correct position during soldering. Because the pins are thick and stiff, each pair of deformed pins provide very high normal forces against the inside of the corresponding pair of opposing printed circuit board holes into which the pins are inserted. Also, location of the crimp is not dependent upon thickness of the printed circuit board because retention depends upon the complementary normal forces of a pair of pins against two opposing printed circuit board holes. The complementary action of each pin of the pair against the corresponding surface of the hole provides retention, no matter whether the board is relatively thin or thick. Also, the thick pins allow for very little room for offset without creating very high insertion forces.

BRIEF DESCRIPTION OF THE DRAWINGS

FIGS. 4, 4A, and 4B are also respectively similar views of two pairs of crimped pins in a single row, right angle header.

DESCRIPTION OF THE PREFERRED EMBODIMENTS

Figure 1:
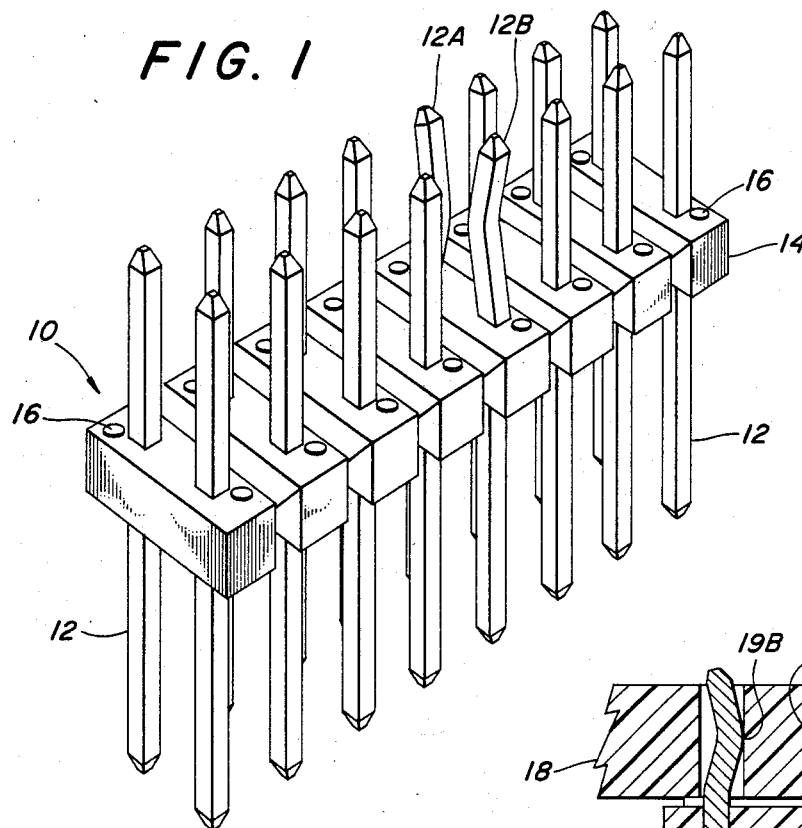
FIG. 1 is a perspective view of a first embodiment of the present invention illustrating a pair of crimped retaining pins in a double row vertical header.

FIG. 1 illustrates a first embodiment of the present invention wherein a double row vertical header 10 is shown. The header comprises two rows of square male terminal pins 12. Such male terminal pins are an industry standard 0.025 inches square.

The pins are held in a plastic retainer or wafer 14. In FIG. 1, a pair of adjoining pins, 12A and 12B, have been crimped as shown at their terminal or insertion end. In the embodiment shown, the deformation is such that the crimped portions of pins 12A and 12B extend toward each other. The retention feature of the present invention will work equally well if the crimped portions both extend away from each other. What is important is that each crimped portion of the pair cooperate against corresponding surfaces in the printed circuit board holes, as explained below. Buttons 16 are provided on the wafer 14 to provide an offset between wafer and printer circuit board after insertion of the header 10. This allows for adequate cleaning after the soldering operation.

Figure 1B:
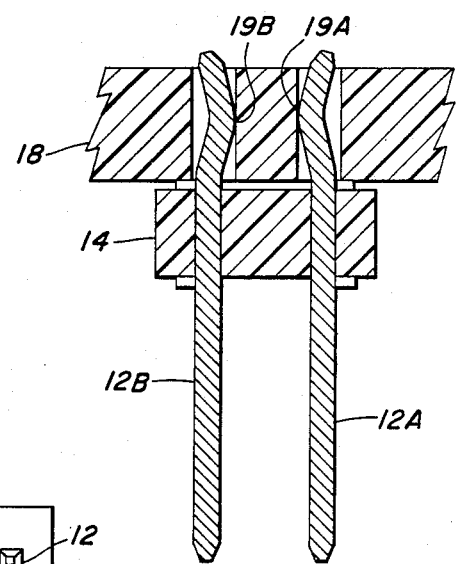
FIG. 1B is a sectional view taken along the line B—B of FIG. 1A, after insertion in a printed circuit board.
Figure 1A:
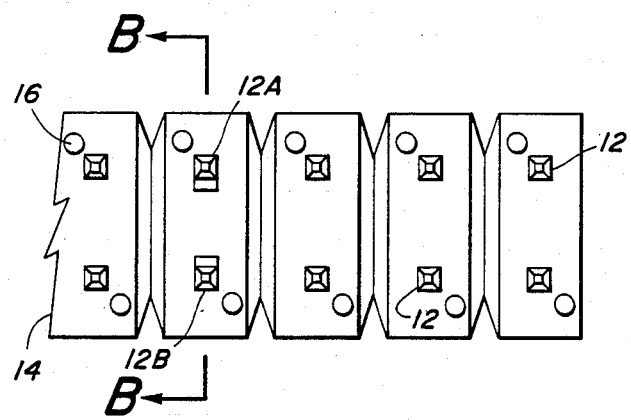
FIG. 1A is a top view of FIG. 1.

FIG. 1B illustrates the retention action of the pair of crimped pins 12A and 12B after the header 10 is inserted into a printed circuit board 18. The crimped end of the pins are shown within the holes of the board. It should be noted that retention can be achieved by contact of the crimped portion of each lead with only one side of its hole at points identified as 19A and 19B, respectively. The normal forces exerted against hole surfaces 19A and 19B by the crimped portion of pins 12A and 12B is sufficiently high to provide the necessary retention during the soldering operation.

Since only one surface of each hole is necessary for retention, the thickness of the printed circuit board is not as critical as where retention due to a terminal or lead deformation requires contact with opposite sides of the same to circuit board hole. Thus the present invention operates equally well in very thin and very thick printed circuit boards. What is important is that at least a pair of complementary pins be similarly crimped so that normal forces of the crimped portion of each act cooperatively against the corresponding surface of each respective printed circuit board hole.

Figure 2:
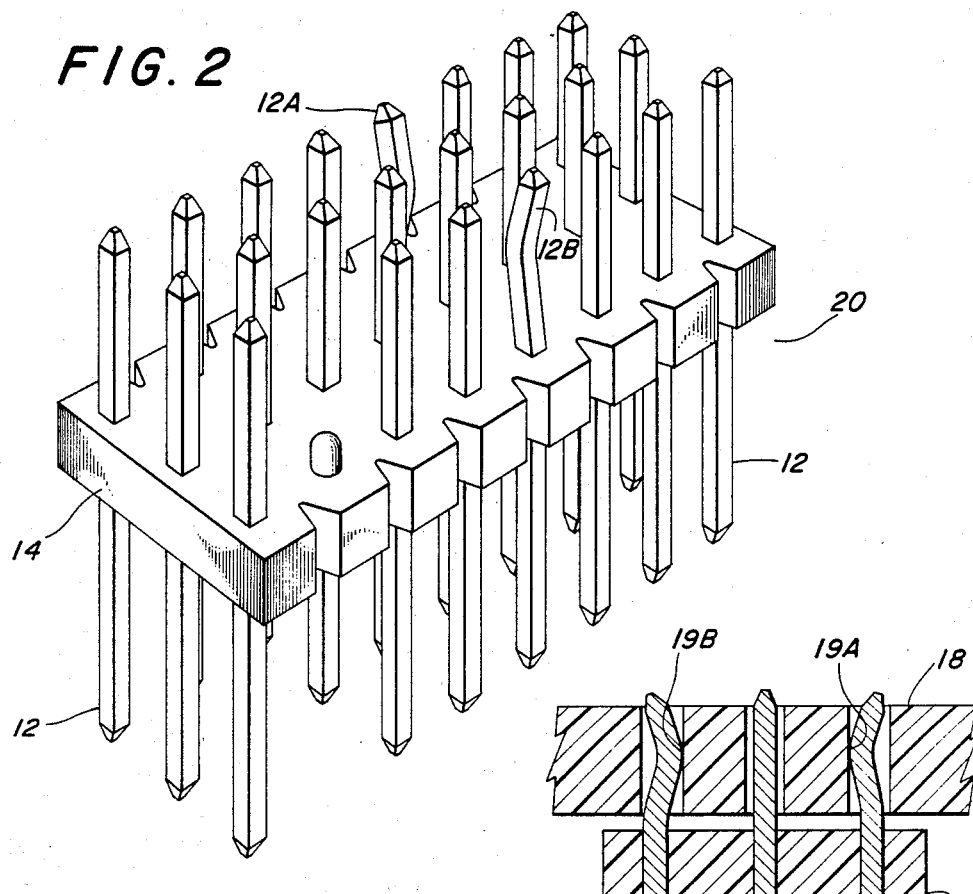
FIGS. 2, 2A and 2B are respectively similarly views of a second embodiment of the present invention illustrating a pair of crimped retaining pins in a triple row vertical header.
Figure 2B:
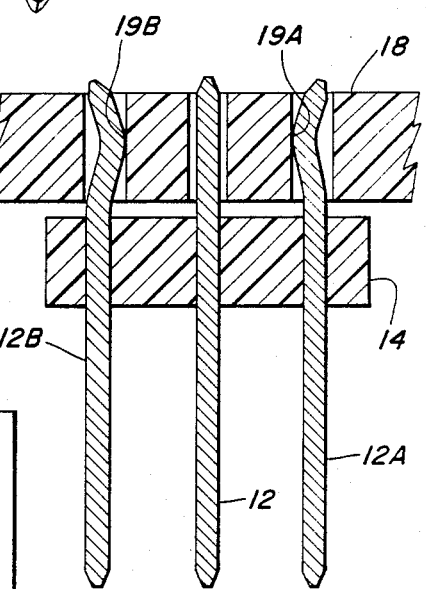
Figure 2A:
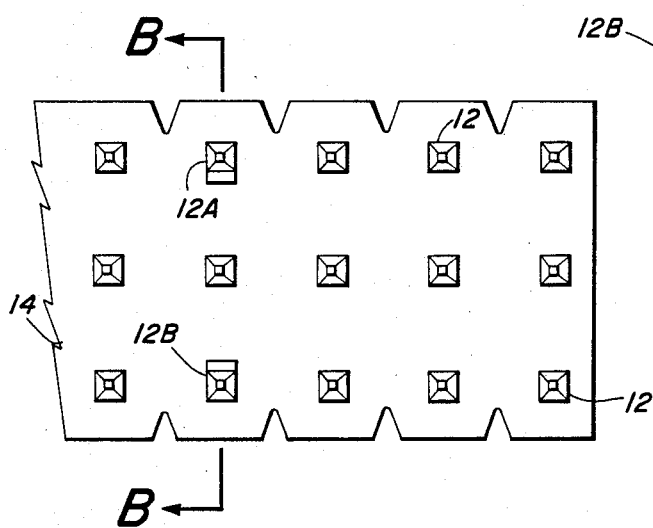

FIGS. 2, 2A and 2B illustrate a second embodiment of the present invention where like parts are identified by the same reference number. This second embodiment shows a triple row vertical header 20 differing from header 10 essentially only in that it contains three instead of two rows of pins 12. A single pair of crimped terminals 12A and 12B is utilized here also, one from the first and third rows. They are separated by a regular pin 12. The retention action in the printed circuit board 18 is otherwise identical as shown in FIG. 2B.

Figure 3:
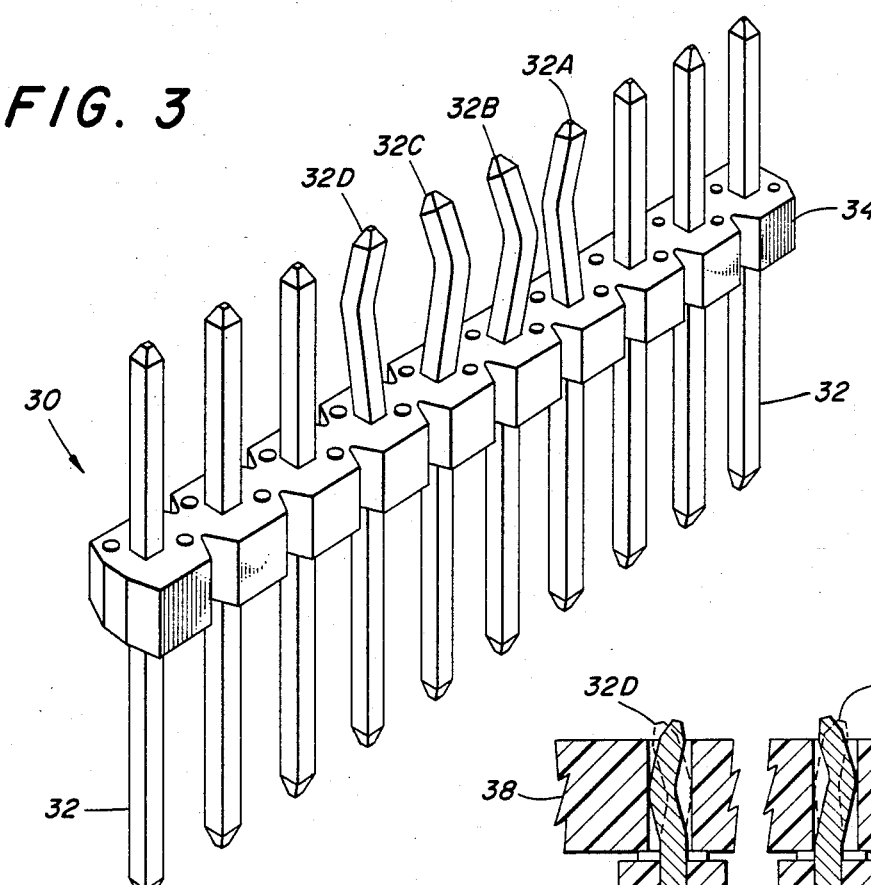
FIGS. 3, 3A, 3B, and 3C are also respectively similar views of a third embodiment of the present invention illustrating two pairs of crimped retaining pins in a single row vertical header.
Figures 3B, 3C:
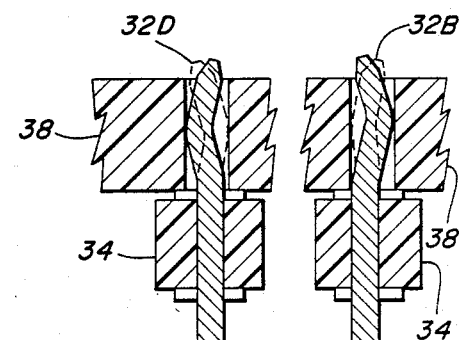
Figure 3A:
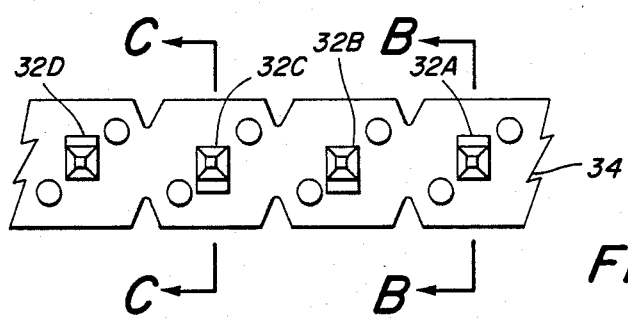

FIGS. 3, 3A and 3B illustrate a third embodiment of the present invention. The header 30 in the embodiment comprises but a single row of pins held in a plastic wafer 34 similar to 14 of the prior embodiments.

Since only a single row is used, the retaining pins with crimped ends must be in the same row. In the embodiment of FIG. 3, two pairs of pins are crimped in alternating directions. One pair of oppositely crimped pins, however, will also provide adequate retention. Pairs 32A and 32B cooperate with one another as do pairs 32C and 32D in a manner similar to the single pair of crimped pins in the first two embodiments to provide retention of the header in the printed circuit board. Thus, as shown in FIG. 3B, complementary crimped terminals 32A (shown in solid) and 32B (shown in phantom) have their crimped portion exerting normal forces against opposite surfaces of their respective printed circuit board holes, thereby achieving the same retention action as in the prior embodiments. Likewise, the same is true for crimped terminals 32C (solid) and 32C (phantom) shown in FIG. 3D.

FIGS. 4, 4A and 4B illustrate a fourth embodiment of the present invention. The header 40 is also a single row header but the terminal pins 42 are bent at right angles at one end. This is because header 40 is designed to be inserted into printed circuit board 48 at right angles as shown in FIG. 4C. As before, the pins 42 are held by a plastic wafer 44. Header 40 also has two pairs of pins crimped alternatively as in the header of FIG. 3. The crimps are at the right angle portion of the pins for obvious reasons. Thus, as in the case of the embodiment of FIG. 3, pairs 42A and 42B and pairs 42C and 42D of crimped terminals cooperate to retain the header in the printed circuit board 48. FIG. 4B illustrates the previously explained cooperative retaining action between crimped pin 42B (solid) and 42A (phantom). The same occurs in the case of pins 42C and 42D. Again, adequate retention can be obtained with a single pair of crimped pins.

Figure 5:
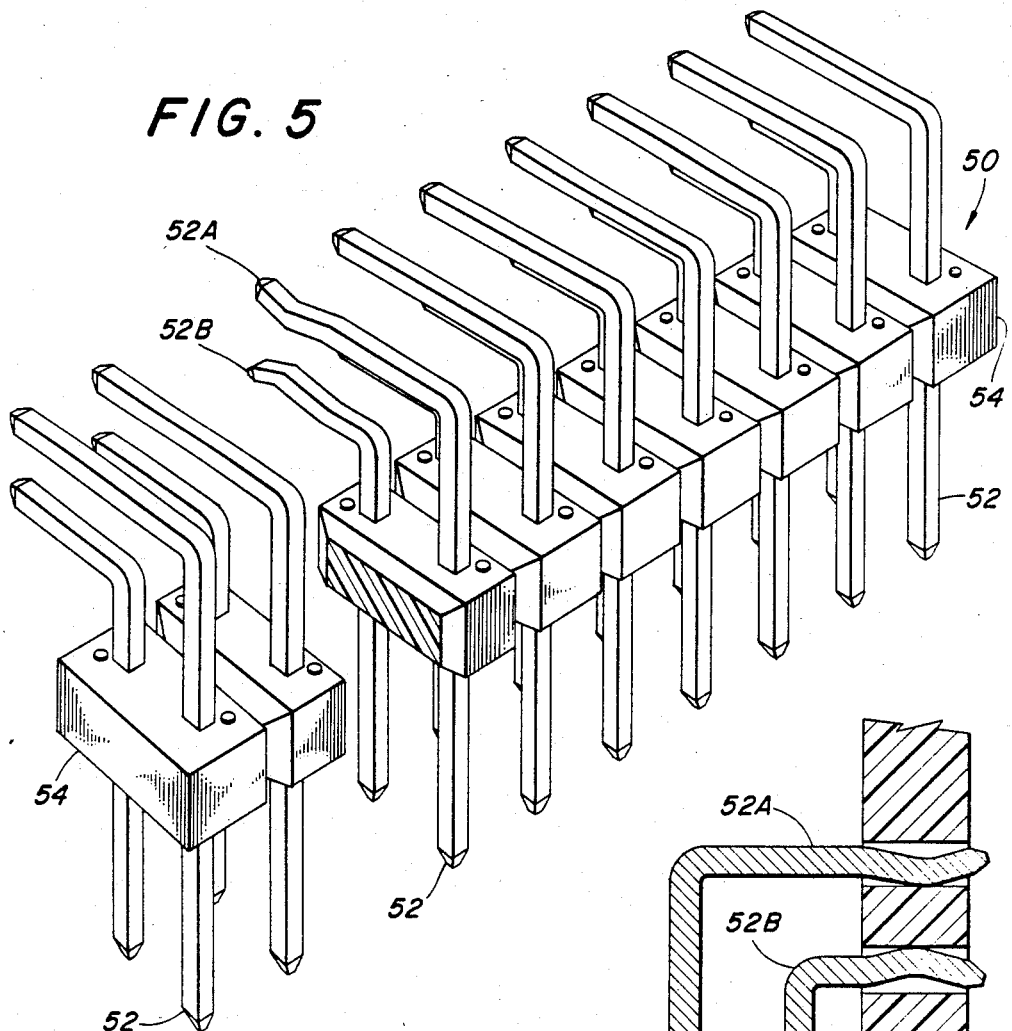
FIGS. 5, 5A and 5B are also respectively similar views of a pair of crimped retaining pins in a double row, right angle header.
Figure 5A:
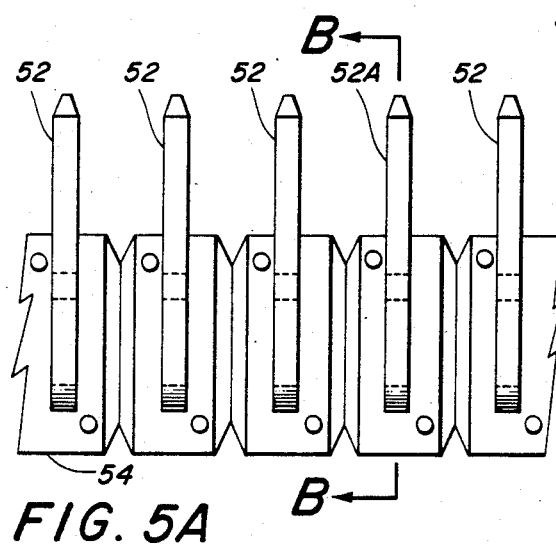
Figure 5B:
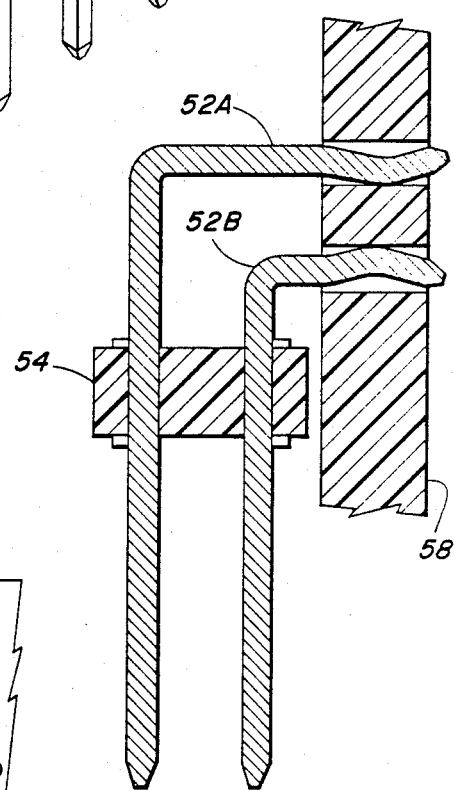

FIGS. 5, 5A and 5B illustrate a fifth embodiment of the present invention. The headers 50 is a double row, right angle header, meaning that it comprises a double row of pins 52 held by a wafer 54 where all the pins are set at right angles for insertion into a printed circuit board. A pair of pins 52A and 52B are crimped in the manner previously described. Thus, when the header 50 is inserted into the printed circuit board 58, crimped terminals cooperate as did crimped pins 12A and 12B ion the embodiment of FIG. 1 to retain header 50 in the proper position during soldering.

It is to be understood that the forms of the invention shown and described herein are but preferred embodiments and the various changes may be in that departing from the spirits and scope of the invention.

I claim:

1. An electrical connector with retention means for maintaining the connector in place during soldering of said connector to a printed circuit board, comprising:
   a header having a plurality of terminal pins mounted therein, said pins being relatively thick and stiff and extending from the header for insertion through respective holes of the printed circuit board;
   at least one pair of said pins having at the insertion end of each pin an offset in the form of a crimp, the crimp of one pin extending in a direction opposite to the crimp of the other pin of said pair, each said crimp being shaped so that each pin of said pair contacts the printed circuit board only within its respective hole and only on one side of the hole and only at its crimp, each said crimp thereby exerting a relatively high normal force against said board only at said one side of the hole, the rest of said plurality of pins being straight;
   whereby when the pins of the header are inserted through the holes of the printed circuit board and positioned for soldering, the header is retained in position for soldering solely by the normal forces exerted by each said crimp at its contact with the printed circuit board within its respective hole, said normal forces being opposite and complementary in that the crimp of one of said pair of pins exerts a normal force against said board which is opposite to the normal force exerted by the crimp of the other pin of said pair, said opposite and complementary normal forces and the resulting frictional contact between each said crimp and the board thereby providing the only means for retaining the header in position for soldering, the rest of said plurality of pins being free from contact with the board in said holes until soldered thereto.

2. The electrical connector of claim 1 wherein said terminal pins have square cross sections.

3. The electrical connector of claim 2 wherein the crimps of said pair of pins extend toward each other.

4. The electrical connector of claim 2 wherein the crimps of said pair of pins extend away from each other.

5. The electrical connector of claim 1 wherein the header comprises two rows of pairs, each row containing one each of said pair of crimped pins.

6. The electrical connector of claim 5 wherein the insertion end of all the pins of the header are formed at right angles to the remainder of said pins, the crimp of each pin of said pair being located at said right angle insertion end.

7. The electrical connector of claim 5 wherein the header comprises three rows of pins, two of said rows containing one each of said pairs of crimped pins.

8. The electrical connector of claim 1 wherein the header comprises a single row of pins and said pair of crimped pins are located in said single.

9. The electrical connector of claim 8 wherein the insertion end of all the pins of the header are formed at right angles to the remainder of the pins, the crimp of each pin of said pair being located at said right angle insertion end.

10. The electrical connector of claim 8 wherein further comprising a second pair of crimped pins, both pins of each pair being positioned adjacent one another in the row.

* * * * *

REEXAMINATION CERTIFICATE (2397th)
United States Patent [19]
Doutrich

[11] B1 4,847,588
[45] Certificate Issued Sep. 20, 1994

[54] ELECTRICAL CONNECTOR WITH PIN RETENTION FEATURE

[75] Inventor: Ray C. Doutrich, Lebanon, Pa.

[73] Assignee: E. I. Du Pont de Nemours and Company, Wilmington, Del.

Reexamination Requests:
No. 90/002,264, Feb. 1, 1991
No. 90/002,372, Jun. 21, 1991

Reexamination Certificate for:
Patent No.: 4,847,588
Issued: Jul. 11, 1989
Appl. No.: 53,550
Filed: May 26, 1987

Related U.S. Application Data

[63] Continuation of Ser. No. 836,534, Mar. 5, 1986, abandoned.

[51] Int. Cl.$^5$ .......................................... H01R 13/428
[52] U.S. Cl. ...................................... 439/751; 439/82
[58] Field of Search ................................. 439/78–84, 439/751, 873

[56] References Cited

U.S. PATENT DOCUMENTS

| | | |
|---|---|---|
| Re. 33,005 | 8/1989 | Bryce . |
| 2,814,024 | 11/1957 | Narozny . |
| 2,893,006 | 7/1959 | Stuhre . |
| 3,444,617 | 5/1969 | Stricker et al. . |
| 3,486,224 | 12/1969 | Chaney . |
| 3,545,080 | 12/1970 | Evans . |
| 3,634,819 | 1/1972 | Evans . |
| 3,696,323 | 10/1972 | Kinkaid et al. . |
| 3,704,515 | 12/1972 | Nelson . |
| 3,786,402 | 1/1974 | Horecky . |
| 3,827,004 | 7/1974 | Vanden Heuvel et al. . |
| 3,865,459 | 2/1975 | Mills . |
| 3,910,671 | 10/1975 | Townsend . |
| 3,923,365 | 12/1975 | Lynch . |
| 3,963,316 | 6/1976 | Williams . |
| 3,973,322 | 8/1976 | Boynton . |
| 3,975,072 | 8/1976 | Ammon . |
| 3,975,076 | 8/1976 | Shida et al. . |
| 4,050,769 | 9/1977 | Ammon ..................... 439/701 |
| 4,066,326 | 1/1978 | Lovendusky . |
| 4,127,692 | 11/1978 | Boynton . |
| 4,157,207 | 6/1979 | Robinson . |
| 4,186,982 | 2/1980 | Cobaugh et al. . |
| 4,191,440 | 3/1980 | Schramm . |
| 4,274,699 | 6/1981 | Keim . |
| 4,274,700 | 6/1981 | Keglewitsch et al. . |
| 4,286,837 | 9/1981 | Yasutake et al. . |
| 4,288,139 | 9/1981 | Cobaugh et al. . |
| 4,324,451 | 4/1982 | Ammon et al. . |
| 4,332,431 | 6/1982 | Bobb et al. . |
| 4,338,717 | 7/1982 | Damon . |
| 4,343,530 | 8/1982 | Leger . |
| 4,353,609 | 10/1982 | Haas . |
| 4,363,529 | 12/1982 | Loose . |
| 4,377,821 | 3/1983 | Weisenburger . |
| 4,381,134 | 4/1983 | Anselmo et al. . |
| 4,415,212 | 11/1983 | De Pillo . |
| 4,415,220 | 11/1983 | Kant . |
| 4,435,031 | 3/1984 | Black et al. . |
| 4,513,499 | 4/1985 | Roldan . |
| 4,538,878 | 9/1985 | Dambach et al. . |
| 4,575,167 | 3/1986 | Minter . |
| 4,580,869 | 4/1986 | Demurjian . |
| 4,586,778 | 5/1986 | Walter et al. . |
| 4,606,589 | 8/1986 | Elsbree, Jr. et al. . |
| 4,619,495 | 10/1986 | Sochor . |
| 4,641,909 | 2/1987 | Steffinger . |
| 4,655,537 | 4/1987 | Andrews, Jr. . |
| 4,678,250 | 7/1987 | Romine et al. . |
| 4,691,979 | 9/1987 | Manska . |
| 4,704,790 | 11/1987 | Soth . |
| 4,743,081 | 5/1988 | Cobaugh . |
| 4,762,498 | 8/1988 | Harting et al. . |
| 4,775,326 | 10/1988 | Lenaerts et al. . |
| 4,776,807 | 10/1988 | Triner et al. . |
| 4,778,396 | 10/1988 | Spooren . |
| 4,793,817 | 12/1988 | Hiesbock . |
| 4,854,900 | 8/1989 | Muhlhoff . |

FOREIGN PATENT DOCUMENTS

| | | |
|---|---|---|
| 0105044 | 4/1984 | European Pat. Off. . |
| 1490236 | 10/1969 | Fed. Rep. of Germany . |
| 7912573 | 8/1979 | Fed. Rep. of Germany . |
| 40-22823 | 8/1965 | Japan . |
| 50-115977 | 9/1975 | Japan . |

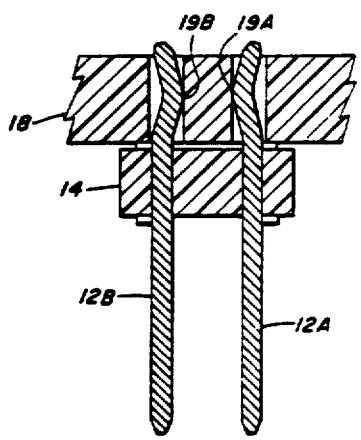

| | | |
|---|---|---|
| 52-43810 | 10/1977 | Japan . |
| 52-43838 | 10/1977 | Japan . |
| 52-161454 | 12/1977 | Japan . |
| 55-17386 | 2/1980 | Japan . |
| 55-19792 | 2/1980 | Japan . |
| 55-47788 | 3/1980 | Japan . |
| 55-21483 | 5/1980 | Japan . |
| 55-108681 | 7/1980 | Japan . |
| 55-121285 | 9/1980 | Japan . |
| 56-72485 | 6/1981 | Japan . |
| 56-105271 | 8/1981 | Japan . |
| 56-114078 | 9/1981 | Japan . |
| 57-38579 | 3/1982 | Japan . |
| 57-80087 | 5/1982 | Japan . |
| 57-80683 | 5/1982 | Japan . |
| 57-82076 | 5/1982 | Japan . |
| 57-86270 | 5/1982 | Japan . |
| 57-122677 | 7/1982 | Japan . |
| 57-123669 | 8/1982 | Japan . |
| 57-155663 | 9/1982 | Japan . |
| 57-155672 | 9/1982 | Japan . |
| 57-158973 | 9/1982 | Japan . |
| 57-167574 | 10/1982 | Japan . |
| 57-178377 | 11/1982 | Japan . |
| 57-197769 | 12/1982 | Japan . |
| 58-38543 | 8/1983 | Japan . |
| 58-131571 | 9/1983 | Japan . |
| 58-142863 | 9/1983 | Japan . |
| 58-146374 | 10/1983 | Japan . |
| 58-165980 | 11/1983 | Japan . |
| 59-9476 | 1/1984 | Japan . |
| 59-25167 | 2/1984 | Japan . |
| 59-25168 | 2/1984 | Japan . |
| 59-41979 | 3/1984 | Japan . |
| 59-61484 | 4/1984 | Japan . |
| 59-95575 | 6/1984 | Japan . |
| 60-92471 | 6/1985 | Japan . |
| 60-41647 | 12/1985 | Japan . |
| 60-193676 | 12/1985 | Japan . |
| 61-23272 | 2/1986 | Japan . |

OTHER PUBLICATIONS

AMP Ampmodu MTE Interconnection System Catalog, Issued Nov. 1985, pp. 1-3, 18-25.
Japanese Matsushita, "National" Product Brochure.

*Primary Examiner*—Gary F. Paumen

[57] ABSTRACT

An electrical connector comprising a header with a plurality of terminal pins having means for retaining the header in position during soldering to a printed circuit board. Retention is accomplished by an offset formed as a crimp at the insertion end of at least one pair of terminals. The crimps exert opposite normal forces against one surface of their respective holes to retain the header during soldering.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–6 are cancelled.

Claims 7, 8, 10 are determined to be patentable as amended.

Claim 9, dependent on an amended claim, is determined to be patentable.

New claims 11–14 are added and determined to be patentable.

7. *An electrical connector with retention means for maintaining the connector in place during soldering of said connector to a printed circuit board, comprising:*
- *a header having a plurality of terminal pins mounted therein, said pins being relatively thick and stiff and extending from the header for insertion through respective holes of the printed circuit board;*
- *at least one pair of said pins, but substantially less than all pins, having at the insertion end of each pin an offset in the form of a bent crimp, the crimp of one pin extending in a direction opposite to the crimp of the other pin of said pair, each said crimp being shaped so that each pin of said pair contacts the printed circuit board only within its respective hole and only on one side of the hole and only at its crimp, each said crimp thereby exerting a relatively high normal force against said board only at said one side of the hole, the rest of said plurality of pins being straight;*
- *wherein the pins of the header are inserted through the holes of the printed circuit board and positioned for soldering and the header is retained in position for soldering solely by the normal forces exerted by each said crimp at its contact with the printed circuit board within its respective hole, said normal forces being opposite and complementary in that the crimp of one of said pair of pins exerts a normal force against said hole which is opposite to the normal force exerted by the crimp of the other pin of said pair against its respective hole, said opposite and complementary normal forces and the resulting frictional contact between each said crimp and the respective hole thereby providing the only means for retaining the header in position for soldering, the rest of said plurality of pins being free from contact with the board in said holes until soldered thereto;*
- *wherein the header comprises two rows of pairs, each row containing one each of said pair of crimped pins and* [The electrical connector of claim 5] wherein the header comprises three rows of pins, two of said rows containing one each of said pairs of crimped pins.

8. *An electrical connector with retention means for maintaining the connector in place during soldering of said connector to a printed circuit board, comprising:*
- *a header having a plurality of terminal pins mounted therein, said pins being relatively thick and stiff and extending from the header for insertion through respective holes of the printed circuit board;*
- *at least one pair of said pins, but substantially less than all pins, having at the insertion end of each pin an offset in the form of a bent crimp, the crimp of one pin extending in a direction opposite to the crimp of the other pin of said pair, each said crimp being shaped so that each pin of said pair contacts the printed circuit board only within its respective hole and only on one side of the hole and only at its crimp, each said crimp thereby exerting a relatively high normal force against said board only at said one side of the hole, the rest of said plurality of pins being straight;*
- *wherein the pins of the header are inserted through the holes of the printed circuit board and positioned for soldering and the header is retained in position for soldering solely by the normal forces exerted by each said crimp at its contact with the printed circuit board within its respective hole, said normal forces being opposite and complementary in that the crimp of one of said pair of pins exerts a normal force against said hole which is opposite to the normal force against said hole which is opposite to the normal force exerted by the crimp of the other pin of said pair against its respective hole, said opposite and complementary normal forces and the resulting frictional contact between each said crimp and the respective hole thereby providing the only means for retaining the header in position for soldering, the rest of said plurality of pins being free from contact with the board in said holes until soldered thereto;* [The electrical connector of claim 1] wherein the header comprises a single row of pins and said pair of crimped pins are located in said single row.

10. The electrical connector of claim 8 [wherein] *further comprising* a second pair of crimped pins, both pins of each pair being positioned adjacent one another in the row.

*11. An electrical connector with retenting means for maintaining the connector in place during soldering of said connector to a printed circuit board, comprising:*
- *a header having a plurality of terminal pins mounted therein, said pins being relatively inflexible and extending from the header for insertion through respective holes of the printed circuit board;*
- *at least one pair of said pins, but substantially less than all pins, having at the insertion end of each pin an offset in the form of a crimp, the crimp of one pin extending in a direction opposite to the crimp of the other pin of said pair, each said crimp being shaped so that each pin of said pair contacts the printed circuit board only within its respective hole and only on one side of the hole and only at its crimp, each said crimp thereby exerting a relatively high normal force against said board only at said one side of the hole, the rest of said plurality of pins remaining uncrimped;*
- *wherein when the pins of the header are inserted through the holes of the printed circuit board and positioned for soldering, the header is retained in position for soldering solely by the normal forces exerted by each said crimp at its contact with the printed circuit board within its respective hole, said normal forces being* opposite and complementary in that the crimp of one of said pair of pins exerts a normal force against said hole which is opposite to the normal force exerted by the crimp of the other pin of said pair against is respective hole, said opposite and complementary normal forces and the resulting frictional contact between each said crimp and the respective hole thereby providing the only means for retaining the header in position for soldering, the rest of said plurality of pins being free from contact with the board in said holes until soldered thereto;

wherein the header comprises two rows of pairs, each row containing one each of said pair of crimped pins and wherein the header comprises three rows of pins, two of said rows contains one each of said pairs of crimped pins.

12. An electrical connector with retention means for maintaining the connector in place during soldering of said connector to a printed circuit board, comprising:

a header having a plurality of terminal pins mounted therein, said pins being relatively inflexible and extending from the header for insertion through respective holes of the printed circuit board;

at least one pair of said pins, but substantially less than all pins, having at the insertion end of each pin an offset in the form of a crimp, the crimp of one pin extending in a direction opposite to the crimp of the other pin of said pair, each said crimp being shaped so that each pin of said pair contacts the printed circuit board only within its respective hole and only on one side of the hole and only at its crimp, each said crimp thereby exerting a relatively high normal force against said board only at said one side of the hole, the rest of said plurality of pins remaining uncrimped;

wherein when the pins of the header are inserted through the holes of the printed circuit board and positioned for soldering, the header is retained in position for soldering solely by the normal forces exerted by said crimp at its contact with the printed circuit board within its respective hole, said normal forces being opposite and complementary in that the crimp of one of said pair of pins exerts a normal force against said hole which is opposite to the normal force exerted by the crimp of the other pin of said pair against is respective hole, said opposite and complementary normal forces and the resulting frictional contact between each said crimp and the respective hole thereby providing the only means for retaining the header in position for soldering, the rest of said plurality of pins being free from contact with the board in said holes until soldered thereto;

wherein the header comprises a single row of pins and said pair of crimped pins are located in said single row.

13. The electrical connector of claim 12 wherein the insertion end of all the pins of the header are formed at right angles to the remainder of the pins, the crimp of each pin of said pair being located at said right angle insertion end.

14. The electrical connector of claim 12 further comprising a second pair of crimped pins, both pins of each pair being positioned adjacent one another in the row.

* * * * *